(12) United States Patent
Chang et al.

(10) Patent No.: US 12,150,341 B2
(45) Date of Patent: Nov. 19, 2024

(54) DISPLAY DEVICES, DISPLAY PANELS AND TRANSPARENT DISPLAY PANELS THEREOF

(71) Applicant: KunShan Go-Visionox Opto-Electronics Co., Ltd., Jiangsu (CN)

(72) Inventors: Miao Chang, Kunshan (CN); Lu Zhang, Kunshan (CN); Ji Xu, Kunshan (CN); Meijin Li, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 514 days.

(21) Appl. No.: 17/381,569

(22) Filed: Jul. 21, 2021

(65) Prior Publication Data

US 2021/0351243 A1   Nov. 11, 2021

Related U.S. Application Data

(63) Continuation of application No. PCT/CN2020/085192, filed on Apr. 16, 2020.

(30) Foreign Application Priority Data

Jun. 28, 2019 (CN) .......................... 201910578659.8

(51) Int. Cl.
*H10K 59/00* (2023.01)
*H10K 50/818* (2023.01)
(Continued)

(52) U.S. Cl.
CPC ......... *H10K 59/121* (2023.02); *H10K 50/818* (2023.02); *H10K 50/86* (2023.02);
(Continued)

(58) Field of Classification Search
CPC ........... H10K 59/121; H10K 59/80517; H10K 59/80518
See application file for complete search history.

(56) References Cited

U.S. PATENT DOCUMENTS 9,721,999 B2   8/2017   Lv et al.
9,960,211 B2   5/2018   Lv et al.
(Continued)

FOREIGN PATENT DOCUMENTS

CN   104157673 A   11/2014
CN   107359268 A   11/2017
(Continued)

OTHER PUBLICATIONS

State Intellectual Property Office of the People's Republic of China, Office Action and Search Report Issued in Application No. 201910578659.8, Jul. 1, 2020, 14 pages. (Submitted with Machine/Partial Translation).
(Continued)

*Primary Examiner* — Reema Patel
(74) *Attorney, Agent, or Firm* — Maier & Maier, PLLC

(57) ABSTRACT

A display device, a display panel and a transparent display panel thereof. The transparent display panel includes a light-transmitting substrate, and a plurality of first sub-pixels. The first sub-pixels are located on the light-transmitting substrate. Each of the first sub-pixels includes a light-transmitting region and a non-light-transmitting region. Each of the first sub-pixels includes a first light-reflecting anode, a first light-emitting structure layer, and a first cathode stacked in the non-light-transmitting region. The light-transmitting region completely encloses the non-light-transmitting region, or the non-light-transmitting region completely encloses the light-transmitting region.

16 Claims, 7 Drawing Sheets

(51) Int. Cl.
  *H10K 50/86* (2023.01)
  *H10K 59/121* (2023.01)
  *H10K 59/17* (2023.01)
  *H10K 59/35* (2023.01)
(52) U.S. Cl.
  CPC ............. *H10K 59/17* (2023.02); *H10K 59/35* (2023.02); *H10K 59/351* (2023.02)

(56) References Cited

U.S. PATENT DOCUMENTS

| | | | |
|---|---|---|---|
| 2016/0027850 A1* | 1/2016 | Lv | H10K 59/121 257/40 |
| 2016/0178972 A1 | 6/2016 | Lo et al. | |
| 2017/0278908 A1 | 9/2017 | Lv et al. | |
| 2018/0158417 A1* | 6/2018 | Xiang | G09G 3/3258 |
| 2021/0327990 A1* | 10/2021 | Sun | H10K 59/65 |

FOREIGN PATENT DOCUMENTS

| | | |
|---|---|---|
| CN | 108254963 A | 7/2018 |
| CN | 108628024 A | 10/2018 |
| CN | 108766990 A | 11/2018 |
| CN | 109273497 A | 1/2019 |
| CN | 109285860 A | 1/2019 |
| CN | 109616491 A | 4/2019 |
| CN | 109935173 A | 6/2019 |
| CN | 110289298 A | 9/2019 |

OTHER PUBLICATIONS

State Intellectual Property Office of the People's Republic of China, Office Action and Search Report Issued in Application No. 201910578659.8, Oct. 13, 2020, 12 pages. (Submitted with Machine/Partial Translation).

ISA State Intellectual Property Office of the People's Republic of China, International Search Report Issued in Application No. PCT/CN2020/085192, Jul. 15, 2020, WIPO, 4 pages.

ISA State Intellectual Property Office of the People's Republic of China, Written Opinion of the International Searching Authority Issued in Application No. PCT/CN2020/085192, Jul. 15, 2020, WIPO, 7 pages.

* cited by examiner

US 12,150,341 B2

DISPLAY DEVICES, DISPLAY PANELS AND TRANSPARENT DISPLAY PANELS THEREOF

CROSS-REFERENCE TO RELATED APPLICATION

This application is a continuation application of International Application No. PCT/CN2020/085192 filed on Apr. 16, 2020, which claims priority to Chinese patent application No. 201910578659.8 filed on Jun. 28, 2019. Both applications are incorporated herein by reference in their entireties.

TECHNICAL FIELD

This application relates to the technical field of display devices.

BACKGROUND

With rapid development of display devices, users have increasingly higher requirements on screen-to-body ratio. Since the top of screen needs to be installed with components such as cameras, sensors and earpieces, a part of the top of screen is usually reserved for installing these components, which affects the overall consistency of the screen.

SUMMARY

The present application provides a display device for a full screen display, a display panel and a transparent display panel thereof.

According to a first aspect of the present disclosure, a transparent display panel is provided. The transparent display panel includes a light-transmitting substrate, and a plurality of first sub-pixels. The first sub-pixels are located on the light-transmitting substrate; and each of the first sub-pixel includes a light-transmitting region and a non-light-transmitting region. Each of the first sub-pixels includes a first light-reflecting anode, a first light-emitting structure layer, and a first cathode stacked in the non-light-transmitting region. The light-transmitting region completely encloses the non-light-transmitting region, or the non-light-transmitting region completely encloses the light-transmitting region.

According to a second aspect of the present disclosure, a display device is provided. The display device includes a device body provided with a component region; and the above-mentioned transparent display panel covering the device body; where the component region is located under the transparent display panel, and a photosensitive device that emits or collects light through the transparent display panel is arranged in the component region.

According to a third aspect of the present disclosure, a display panel is provided. The display panel includes a light-transmitting display region provided with the above-mentioned transparent display panel and a non-light-transmitting display region. The non-light-transmitting display region includes a light-transmitting substrate, and a plurality of second sub-pixels on the light-transmitting substrate; and the second sub-pixels are non-light-transmitting sub-pixels.

According to a fourth aspect of the present disclosure, a display device is provided. The display device includes a device body provided with a component region; and the above-mentioned display panel covering the device body; where the component region is located under the light-transmitting display region of the display panel, and a photosensitive device that emits or collects light through the light-transmitting display region is arranged in the component region.

The light emitted by the first light-emitting structure layer of the present application can be reflected back and forth between the first light-reflecting anode and the first cathode many times to produce a microcavity effect, thereby enhancing light emitting efficiency, and narrowing a spectrum, effectively improving the display quality of the transparent display panel. During display by the full screen, the chromaticity coordinate of the transparent display panel are basically consistent with those of the non-transparent display region, and chromaticity coordinate offset will not occur. In addition, the light-transmitting region completely encloses the non-light-transmitting region, or the non-light-transmitting region completely encloses the light-transmitting region, so that the light emitted by each first sub-pixel can be uniformly dispersed to sub-pixels around the first sub-pixel, further reducing the chromaticity coordinate offset of the transparent display panel during display, and at the same time, effectively improving the color rendering consistency of the transparent display panel 1 from different viewing angles.

BRIEF DESCRIPTION OF THE DRAWINGS

FIG. 2b is a schematic diagram of a variant structure of a first sub-pixel in FIG. 2a.

FIG. 2c is a schematic diagram of a variant structure of a first sub-pixel in FIG. 2a.

FIG. 2d is a schematic diagram of a variant structure of a first sub-pixel in FIG. 2a.

FIG. 2e is a schematic diagram of a variant structure of a first sub-pixel in FIG. 2a.

FIG. 2f is a schematic diagram of a variant structure of a first sub-pixel in FIG. 2a.

FIG. 2g is a schematic diagram of a variant structure of a first sub-pixel in FIG. 2a.

DETAILED DESCRIPTION OF THE EMBODIMENTS

In order to make the above objectives, features and advantages of the present application more obvious and understandable, specific embodiments of the present application will be described in detail below with reference to the drawings.

Figure 1:
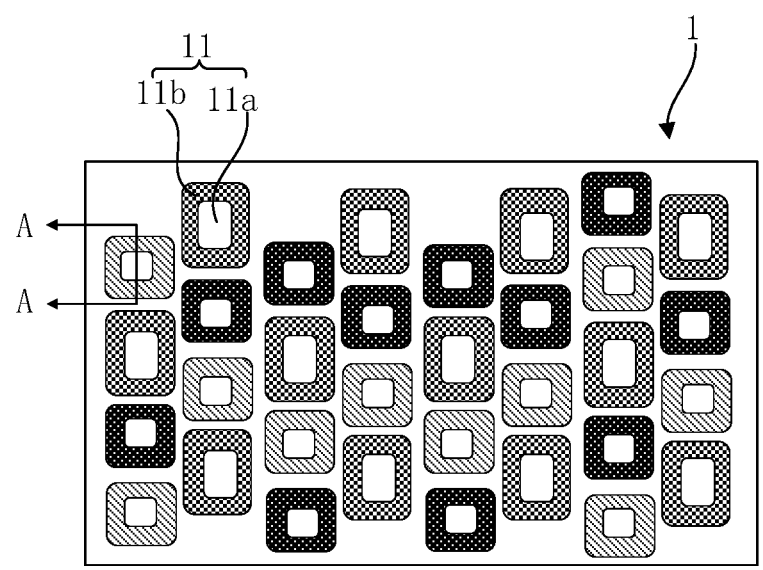
FIG. 1 is a top view of a transparent display panel in an embodiment of the present application, in which a cathode and a polarizer are removed.
Figure 2A:
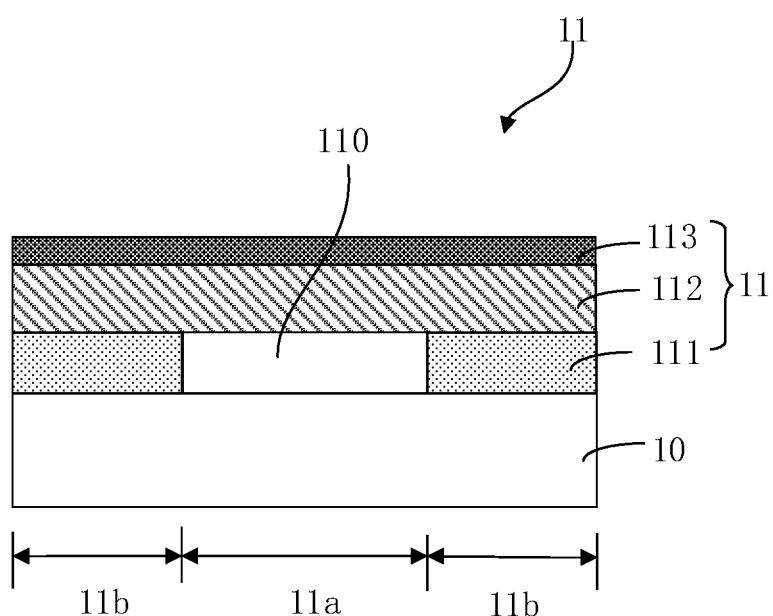
FIG. 2a is a cross-sectional view along line A-A in FIG. 1.
Figure 2B:
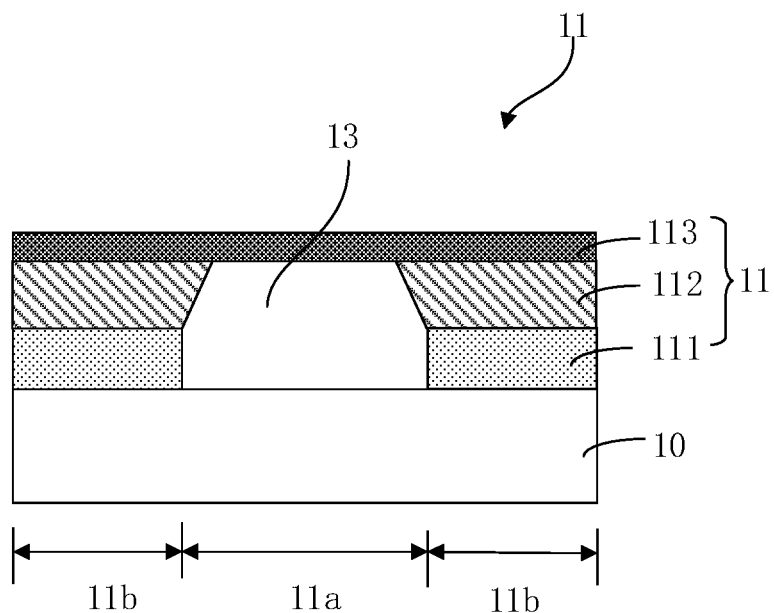
Figure 2C:
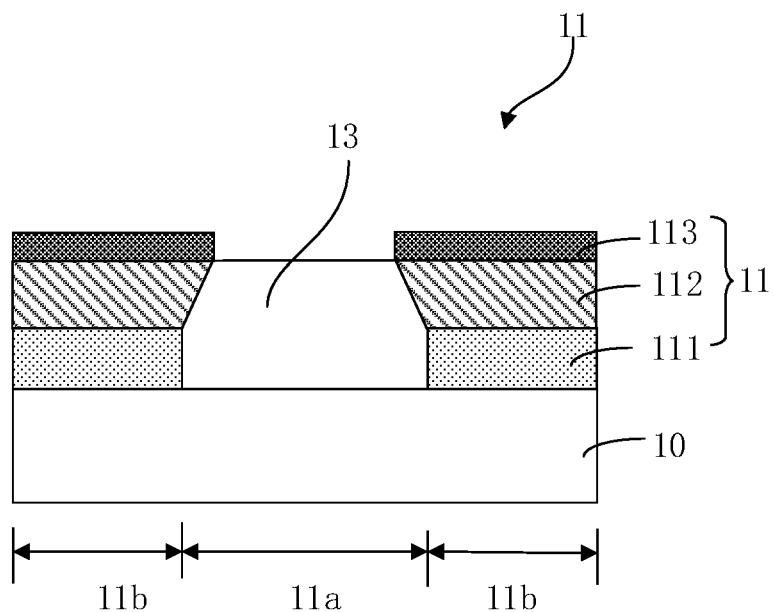
Figure 2D:
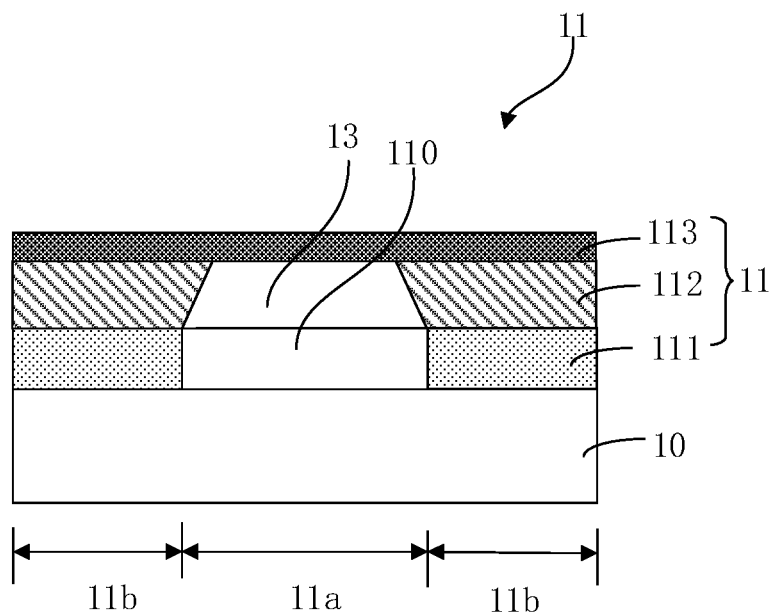
Figure 2E:
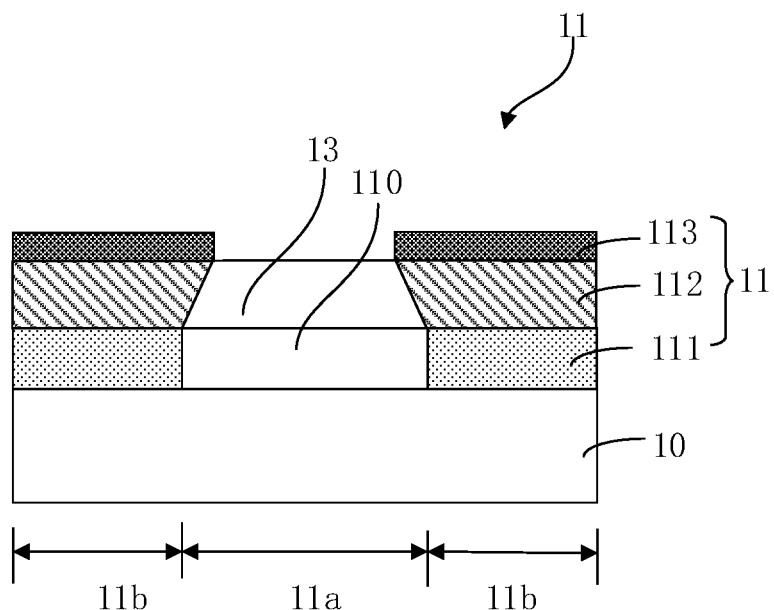
Figure 2F:
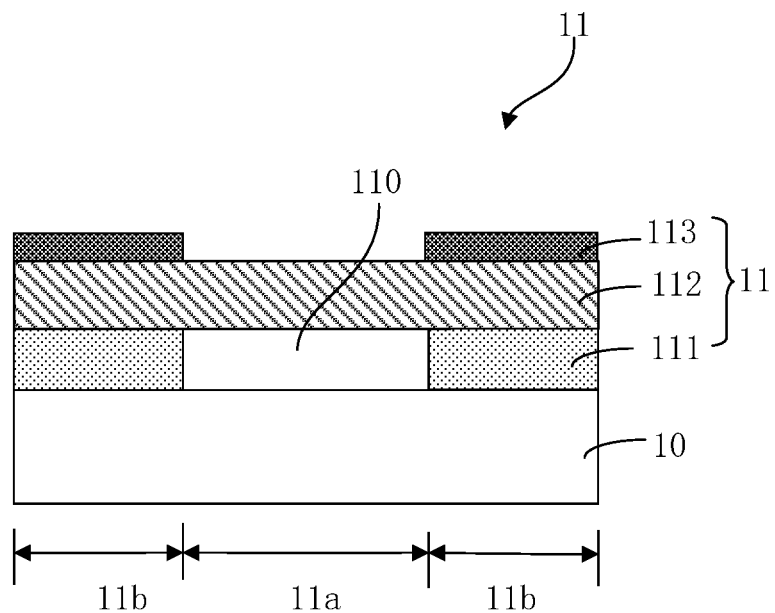
Figure 2G:
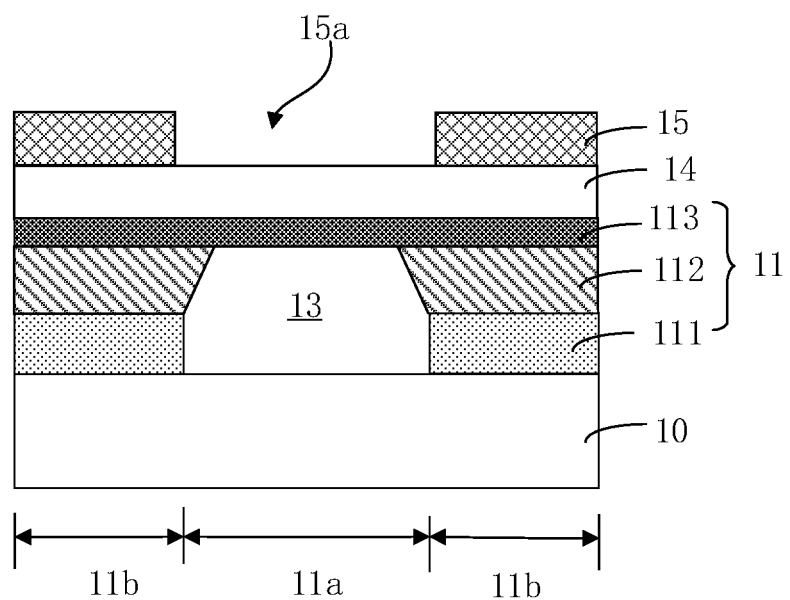

As shown in FIGS. 1 to 2g, the transparent display panel 1 includes a light-transmitting substrate 10 and a plurality of first sub-pixels 11 on the light-transmitting substrate 10. Each of the first sub-pixels 11 includes a light-transmitting region 11a and a non-light-transmitting region 11b. A first light-reflecting anode 111, a first light-emitting structure layer 112 and a first cathode 113 are stacked in the nonlight-transmitting region 11b. The non-light-transmitting region 11b completely encloses the light-transmitting region 11a.

In an embodiment, the light-transmitting substrate 10 may be a flexible substrate, and the material of the flexible substrate may be polyimide. In another embodiment, the light-transmitting substrate 10 may be a rigid substrate, and the material of the rigid substrate may be glass.

The material of the first light-reflecting anode 111 may include metal silver.

The first light-reflecting anode 111 includes a transparent conductive oxide layer, a silver metal layer, and a transparent conductive oxide layer from bottom to top. The transparent conductive oxide may be ITO, but is not limited thereto.

The first light-emitting structure layer 112 may be an OLED layer. In an embodiment as shown in FIG. 1, all first light-emitting structure layers 112 may be red, green or blue light-emitting structure layers alternately distributed. In other embodiments, the first light-emitting structure layers 112 may be red, green, blue, or yellow light-emitting structure layers alternately distributed, or all the first light-emitting structure layers 112 may be of a single color.

A part of the first cathode 113 can transmit light and a part of the first cathode 113 can reflect light. The material of the first cathode 113 may be a magnesium-silver mixture, but is not limited thereto.

As shown in FIGS. 1 to 2g, light emitted by the first light-emitting structure layer 112 can be reflected back and forth between the first light-reflecting anode 111 and the first cathode 113 many times to produce a microcavity effect, thereby enhancing light emitting efficiency, narrowing a spectrum, effectively reducing a chromaticity coordinate offset of the transparent display panel 1 during display and improving the display quality. In addition, the non-light-transmitting region 11b completely encloses the light-transmitting region 11a, so that the light emitted by each first sub-pixel 11 can be uniformly dispersed to sub-pixels around the first sub-pixel 11, further reducing the chromaticity coordinate offset of the transparent display panel 1 during display, and at the same time, effectively improving the color rendering consistency of the transparent display panel 1 from different viewing angles.

In an embodiment, a projection center of the light-transmitting region 11a on the light-transmitting substrate 10 coincides with a projection center of the non-light-transmitting region 11b on the light-transmitting substrate 10, so that the light emitted by the first sub-pixel 11 is more uniformly diverged to sub-pixels around the first sub-pixel 11.

As shown in FIG. 2g, the transparent display panel 1 may further include a polarizer 15. An encapsulation layer 14 may also be provided on the first sub-pixels 11. The encapsulation layer 14 may be a thin film encapsulation layer.

In an embodiment, the encapsulation layer 14 may include a three-layer structure of an inorganic layer, an organic layer, and an inorganic layer.

In an embodiment, the light-transmitting region 11a is configured to emit light. As shown in FIG. 2a, in the first sub-pixel 11, the light-transmitting region 11a is provided with a light-transmitting anode 110. On the light-transmitting anode 110 the first light-emitting structure layer 112 is provided, and the first cathode 113 is provided on the first light-emitting structure layer 112. In each first sub-pixel 11, the light-transmitting anode 110 may be electrically connected to the first light-reflecting anode 111. That is, the light-transmitting region 11a can also be configured to display.

The material of the light-transmitting anode 110 may include a transparent conductive oxide. The transparent conductive oxide may be ITO, but is not limited thereto.

Exemplary, the light-transmitting anode 110 may include a transparent conductive oxide layer.

In the transparent display panel 1 according to an embodiment, the light-transmitting region 11a and the non-light-transmitting region 11b may have a polarizer 15 provided therein.

In another embodiment, the light-transmitting region 11a is only configured to transmit external light, and is not configured to emit light.

As shown in FIG. 2b, in the first sub-pixel 11, a first pixel definition layer 13 and a first cathode 113 are stacked from bottom to top in the light-transmitting region 11a. That is, the light-transmitting region 11a does not include an anode and a first light-emitting structure layer 112. In an embodiment, the first pixel definition layers 13 of all the first sub-pixels 11 and second pixel definition layers between adjacent first sub-pixels 11 may be fabricated in the same process.

In an embodiment, as shown in FIG. 2c, the light-transmitting region 11a of the first sub-pixel 11 only is provided with the first pixel definition layer 13 therein.

In other embodiments, when the light-transmitting region 11a has no anode therein, the light-transmitting region 11a may include the first light-emitting structure layer 112 and the first cathode 113 stacked from bottom to top, or the light-transmitting region 11a only has the first light-emitting structure layer 112. In addition, if openings of a mask for vapor depositing the first light-emitting structure layers 112 are aligned with the non-light-transmitting regions 11b and a size of each opening is not larger than that of each non-light-transmitting region 11b, the first light-emitting structure layer 112 is absent on the first pixel definition layer 13 of the light-transmitting region 11a. Alternatively, the first light-emitting structure layer 112 is vapor deposited on the first pixel definition layer 13 of the light-transmitting region 11a.

In an embodiment, the light-transmitting region 11a has a light-transmitting anode 110 therein, and the light-transmitting region 11a is not configured to emit light.

As shown in FIG. 2d, the light-transmitting region 11a of the first sub-pixel 11 includes a light-transmitting anode 110, a first pixel definition layer 13 and a first cathode 113 stacked from bottom to top.

In an embodiment, as shown in FIG. 2e, the light-transmitting region 11a of the first sub-pixel 11 includes a light-transmitting anode 110 and a first pixel defining layer 13 stacked from bottom to top.

In an embodiment, as shown in FIG. 2f, the light-transmitting region 11a of the first sub-pixel 11 includes a light-transmitting anode 110 and a first light-emitting structure layer 112 stacked from bottom to top. Since the first cathode is not provided, a deviation in aligning the openings of the mask for vapor depositing the first light-emitting structure layers with the non-light-transmitting regions can be effectively avoided.

In an embodiment as shown in FIG. 2g, the polarizer 15 of the transparent display panel 1 includes a plurality of first openings 15a, and each first opening 15a corresponds to one light-transmitting region 11a.

In this way, with the present application, light transmittance of a light-transmitting region 11a can be further increased, thereby increasing the light transmittance of the transparent display panel 1.

In an embodiment, the light-transmitting region 11a includes the first cathode 113, and a thickness of the first cathode 113 of the light-transmitting region 11a may be smaller than a thickness of the first cathode 113 of the non-light-transmitting region 11b.

The transparent display panel 1 has a high light transmittance and a high luminous efficiency. Therefore, a pixel density (Pixels Per Inch, PPI) of the transparent display panel 1 can be effectively increased, thereby increasing a resolution.

In an embodiment, a ratio of an area of the non-light-transmitting region 11b to an area of the light-transmitting region 11a of the first sub-pixel 11 may be in a range of 1:10 to 1:2.

When only the non-light-transmitting region 11b can emit light, the transparent display panel 1 is in a display mode when a driving voltage is applied between the first light-reflecting anode 111 and the first cathode 113 of each first sub-pixel 11, and the transparent display panel 1 is in a light-transmitting mode when no driving voltage is applied between the first light-reflecting anode 111 and the first cathode 113 of each first sub-pixel 11.

When both the non-light-transmitting region 11b and the light-transmitting region 11a can emit light, the transparent display panel 1 is in the display mode when the driving voltage is applied between the first cathode 113 and the first light-reflecting anode 111 of each first sub-pixel 11 and between the first cathode 113 and the light-transmitting anode 110 of each first sub-pixel 11, and the transparent display panel 1 is in the light-transmitting mode when no driving voltage is applied between the first cathode 113 and the first light-reflecting anode 111 of each first sub-pixel 11 and between the first cathode 113 and the light-transmitting anode 110 of each first sub-pixel 11.

The first sub-pixel 11 may be active matrix (AM) driven or passive matrix (PM) driven. The first sub-pixels 11 shown in FIG. 1 are active matrix driven. The first light-reflecting anode 111 (or both the first light-reflecting anode 111 and the light-transmitting anode 110) of each first sub-pixel 11 is an electrode block, and the first cathodes 113 of each first sub-pixel 11 are connected together to form a planar electrode. The transparent display panel 1 may have a pixel driving circuit that drives the first sub-pixels 11 to emit light provided therein, and the pixel driving circuit may be disposed under the non-light-transmitting region 11b.

In an embodiment, the transparent display panel 1 may serve as a sole display panel on a side of a transparent display device. The transparent display panel 1 further includes scan lines, data lines, pixel driving circuits, and a bezel region located around a display region. At this time, the scan lines, data lines, etc. in the display region may be opaque wires or light-transmitting wires.

In other embodiments, the transparent display panel 1 may be a transparent display region on a display device, and the display device may further include other transparent or opaque display regions.

In some embodiments, the first sub-pixels 11 are passive matrix driven, and the first light-reflecting anodes 111 (or both the first light-reflecting anodes 111 and the light-transmitting anodes 110) of each first sub-pixel 11 located in a same row can be connected, and the first cathodes 113 of each first sub-pixel 11 in a same column can be connected. Or, the first light-reflecting anodes 111 (or both the first light-reflecting anodes 111 and the light-transmitting anodes 110) of each first sub-pixel 11 located in the same column can be connected, and the first cathodes 113 of each first sub-pixel 11 in the same row may be connected. The first sub-pixels 11 are located at row-column intersections.

In some embodiments, the non-light-transmitting region 11b completely encloses the light-transmitting region 11a, and a distance between an inner surface and an outer surface of the non-light-transmitting region 11b varies in a circumferential direction. That is, the distance between the inner surface and the outer surface of the non-light-transmitting region 11b is not always equal in the circumferential direction. When the transparent display panel 1 is in the light-transmitting mode, with this configuration, diffraction of light when passing through the area where each first sub-pixel 11 is located can be effectively reduced.

In an embodiment, a projection of the light-transmitting region 11a on the light-transmitting substrate 10 and a projection of the non-light-transmitting region 11b on the light-transmitting substrate 10 are different in shape, so that the distance between the inner surface and the outer surface of the non-light-transmitting region 11b changes in the circumferential direction.

In an embodiment, the projection of the light-transmitting region 11a on the light-transmitting substrate 10 may be a circle shape, an ellipse shape, a dumbbell shape, or a gourd shape. The projection of the non-light-transmitting region 11b on the light-transmitting substrate 10 is a circle shape, an ellipse shape, a dumbbell shape, or a gourd shape, which can further reduce diffraction.

In an embodiment, the shape of the first light-reflecting anode 111 in the non-light-transmitting region 11b, the shape of the openings of the second pixel definition layer on the light-transmitting substrate 10, that is, the shape of the first light-emitting structure layer 112 in the non-light-transmitting region 11b and the shape of the first cathode 113 in the non-light-transmitting region 11b may be circular, elliptical, dumbbell-shaped, or gourd-shaped.

In an embodiment, the light-transmitting anode 110 in the light-transmitting region 11a may be circular, elliptical, dumbbell-shaped, or gourd shaped.

Figure 3:
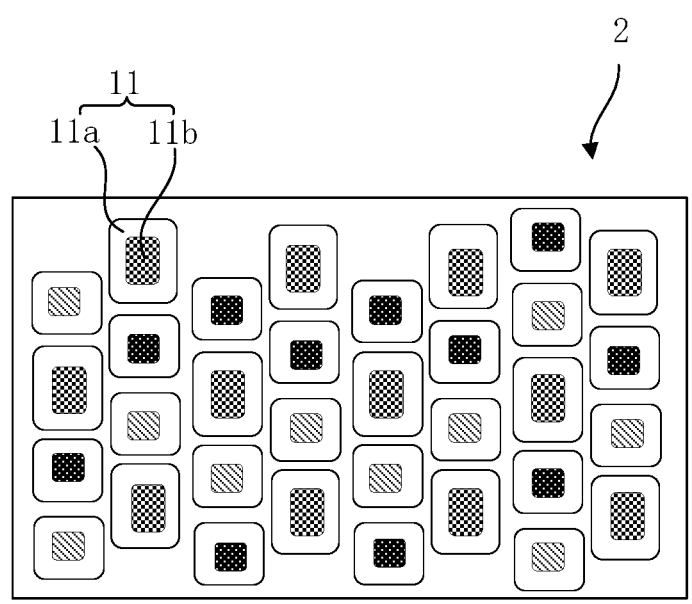
FIG. 3 is a top view of a transparent display panel in another embodiment of the present application, in which a cathode and a polarizer are removed.

As shown in FIG. 3, the structure of the transparent display panel 2 is substantially the same as that of the transparent display panel 1 in FIGS. 1 to 2g, except that the light-transmitting region 11a of the first sub-pixel 11 is arranged around the non-light-transmitting region 11b.

The structure of the light-transmitting region 11a and the non-light-transmitting region 11b are substantially the same as the structure of the light-transmitting region 11a and the non-light-transmitting region 11b of the transparent display panel 1 in the previous embodiment.

In an embodiment, when the transparent display panel 2 is in the light-transmitting mode, a distance between an inner surface and an outer surface of the light-transmitting region 11a can change in the circumferential direction, thereby effectively reducing diffraction of light when passing through the area between the first sub-pixels 11.

In an embodiment, a projection of the light-transmitting region 11a on the light-transmitting substrate 10 and a projection of the non-light-transmitting region 11b on the light-transmitting substrate 10 may be different in shape, so that the distance between the inner surface and the outer surface of the light-transmitting region 11a changes in the circumferential direction.

In an embodiment, the projection of the light-transmitting region 11a on the light-transmitting substrate 10 may be a circle shape, an ellipse shape, a dumbbell shape, or a gourd shape; and/or the projection of the non-light-transmitting region 11b on the light-transmitting substrate 10 is a circle shape, an ellipse shape, a dumbbell shape, or a gourd shape, which can further reduce diffraction.

In an embodiment, the shape of the first light-reflecting anode 111 in the non-light-transmitting region 11*b*, and/or the shape of the openings of the second pixel definition layer on the light-transmitting substrate 10, that is, the shape of the first light-emitting structure layer 112 in the non-light-transmitting region 11*b*, and/or the shape of the first cathode 113 in the non-light-transmitting region 11*b* may be circular, elliptical, dumbbell-shaped, or gourd-shaped.

In an embodiment, the shape of the light-transmitting anode 110 in the light-transmitting region 11*a* may be circular, elliptical, dumbbell-shaped, or gourd-shaped.

Based on the above-mentioned transparent display panels 1 and 2, the present application provides a display device.

The display device may be a transparent display terminal.

The display device includes a device body provided with a component region and the above-mentioned transparent display panel 1 or 2 covering the device body. The component region is located below the transparent display panel 1 or 2, and the component region is provided with a photosensitive component that emits or collects light through the transparent display panel 1 or 2.

The photosensitive component may include a camera and/or a light sensor. The light sensor includes one or a combination of an iris recognition sensor and a fingerprint recognition sensor.

Figure 4:
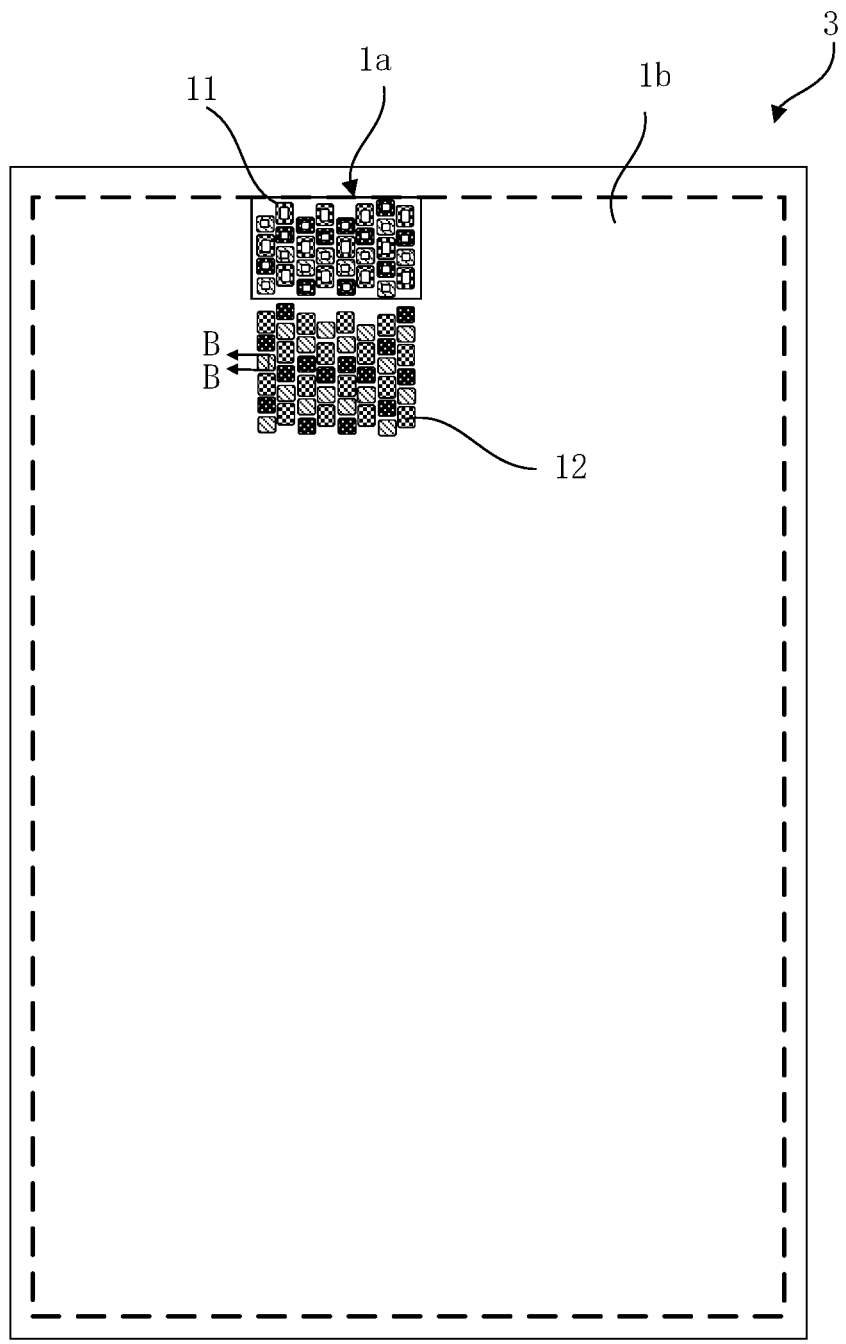
FIG. 4 is a top view of a display panel in an embodiment of the present application.
Figure 5:
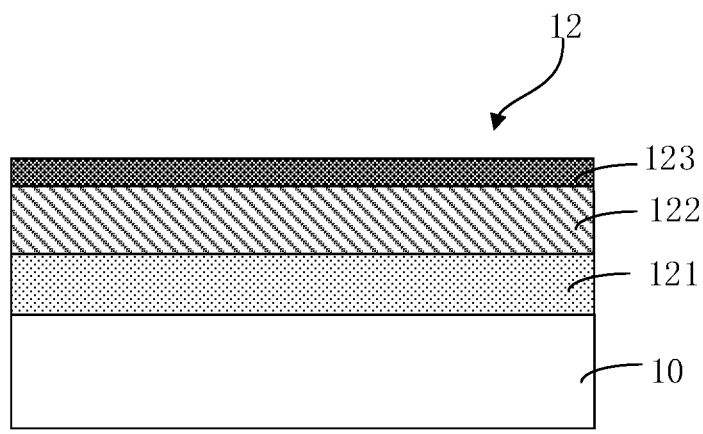
FIG. 5 is a cross-sectional view along line B-B in FIG. 4.

As shown in FIGS. 4 and 5, the display panel 3 in an embodiment includes a light-transmitting display region 1*a* provided with the above-mentioned transparent display panel 1 or 2, a non-light-transmitting display region 1*b* including a light-transmitting substrate 10 and a plurality of second sub-pixels 12 on the light-transmitting substrate 10. The second sub-pixels 12 are non-light-transmitting sub-pixels.

As shown in FIG. 5, each of the second sub-pixels 12 includes: a second light-reflecting anode 121, a second light-emitting structure layer 122 and a second cathode 123 which are stacked thereon.

The material of the second light-reflecting anode 121 can be the same as the material of the first light-reflecting anode 111, and both may be fabricated in the same process.

The material of the second light-emitting structure layer 122 can be the same as the material of the first light-emitting structure layer 112, and both may be fabricated in the same process.

In an embodiment, the second cathode 123 is partially light-transmitting and partially reflective. The second cathode 123 can be made of the same material as the first cathode 113 and manufactured in the same process. The thickness of the second cathode 123 can be greater than the thickness of the first cathode 113 to ensure the light transmittance of the light-transmitting display region 1*a*. In an embodiment, the light transmittance of the light-transmitting display region 1*a* is above 40%.

In an embodiment, the second sub-pixels 12 are active matrix driven, and the second cathodes 123 of each second sub-pixel 12 are connected together to form a planar electrode. When the first sub-pixels 11 are also active matrix driven, the planar electrode formed by connecting the first cathodes 113 of each first sub-pixel 11 may be connected with the planar electrode of each second sub-pixel 12. In an embodiment, the cathode of the light-transmitting display region 1*a* and the non-light-transmitting display region 1*b* is an integral planar electrode.

The light-transmitting display region 1*a* has a high light transmittance and a high luminous efficiency. Therefore, a ratio of the pixel density of the first sub-pixels 11 to the pixel density of the second sub-pixels 12 may range from 1:2 to 1:1. In an embodiment, the ratio of the pixel density of the first sub-pixels 11 to the pixel density of the second sub-pixels 12 may range from 1.5:2 to 1:1, which can effectively reduce the display difference between the light-transmitting display region 1*a* and the non-light-transmitting display region 1*b*.

In an embodiment, as shown in FIG. 4, a shape of the light-transmitting display region 1*a* is rectangular. In other embodiments, the shape of the light-transmitting display region 1*a* may be a drop shape, a circle shape, an ellipse shape, etc.

Based on the above display panel, an embodiment of the present application further provides a display device.

The display device may be a display device such as a mobile phone, a tablet computer, a vehicle display screen, and the like.

The display device includes a device body provided with a component region and any one of the display panels 3 mentioned above. The display panels 3 covers the device body. The component region is located under the light-transmitting display region 1*a* of the display panel 3, and a photosensitive device that emits or collects light through the light-transmitting display region 1*a* is arranged in the component region.

The photosensitive device may include a camera and/or a light sensor. The light sensor includes one or a combination of an iris recognition sensor and a fingerprint recognition sensor. The photosensitive device is arranged under the light-transmitting display region 1*a*. When the photosensitive device is not working, the light-transmitting display region 1*a* and the non-light-transmitting display region 1*b* can display the same picture together. When the photosensitive device is working, the light-transmitting display region 1*a* is in a state of transmitting light but not displaying images, so that external light can pass through the light-transmitting display region 1*a* to reach the photosensitive device.

Although this application is disclosed as above, this application is not limited thereto. Any person skilled in the art can make various changes and amendments without departing from the spirit and scope of this application. Therefore, the protection scope of this application should be based on the scope defined in the claims.

The invention claimed is:

1. A transparent display panel, comprising:
   a light-transmitting substrate, and
   a plurality of first sub-pixels, located on the light-transmitting substrate, wherein each of the first sub-pixels comprises a light-transmitting region and a non-light-transmitting region,
   wherein each of the first sub-pixels comprises a first light-reflecting anode, a first light-emitting structure layer and a first cathode stacked in the non-light-transmitting region, and
   wherein the light-transmitting region is configured to emit light, and a light-transmitting anode, the first light-emitting structure layer, and the first cathode are stacked in the light-transmitting region.

2. The transparent display panel according to claim 1, wherein
   the light-transmitting anode of one of the first sub-pixels is electrically connected to the first light-reflecting anode.

3. The transparent display panel according to claim 1, further comprising:

a polarizer, covering the light-transmitting regions and the non-light-transmitting regions.

4. The transparent display panel according to claim 1, wherein
the first sub-pixels are active matrix driven and first cathodes of each of the plurality of first sub-pixels are connected together.

5. The transparent display panel according to claim 1, wherein
in each of the plurality of the first sub-pixels, a ratio of an area of the non-light-transmitting region to an area of the light-transmitting region ranges from 1:10 to 1:2.

6. The transparent display panel according to claim 5, wherein
a material of the first light-reflecting anode comprises metal silver.

7. The transparent display panel according to claim 6, wherein
the first light-reflecting anode comprises a transparent conductive oxide layer, a silver metal layer, and a transparent conductive oxide layer formed along a bottom-to-top direction.

8. The transparent display panel according to claim 1, wherein
when the non-light-transmitting region completely encloses the light-transmitting region, a distance between an inner surface and an outer surface of the non-light-transmitting region changes in a circumferential direction;
when the light-transmitting region completely encloses the non-light-transmitting region, a distance between an inner surface and an outer surface of the light-transmitting region changes in a circumferential direction.

9. The transparent display panel according to claim 8, wherein
a projection of the light-transmitting region on the light-transmitting substrate is different in shape from a projection of the non-light-transmitting region on the light-transmitting substrate.

10. The transparent display panel according to claim 9, wherein
the projection of the light-transmitting region on the light-transmitting substrate is circular, elliptical, dumbbell-shaped or gourd-shaped; and/or
the projection of the non-light-transmitting region on the light-transmitting substrate is a circular, elliptical, dumbbell-shaped or gourd-shaped.

11. A display panel, comprising:
a light-transmitting display region, provided with the transparent display panel according to claim 1; and
a non-light-transmitting display region, comprising a plurality of second sub-pixels disposed on the light-transmitting substrate and the second sub-pixels being non-light-transmitting sub-pixels.

12. The display panel according to claim 11, wherein
each of the second sub-pixels comprises a second light-reflecting anode, a second light-emitting structure layer and a second cathode which are stacked.

13. The display panel according to claim 12, wherein
the second sub-pixels are active matrix driven, and second cathodes of each of the plurality of the second sub-pixels are connected to form a planar electrode; and
the first sub-pixels are active matrix driven, and the first cathodes of each of the plurality of the first sub-pixels are connected to the planar electrode.

14. The display panel according to claim 13, wherein
a ratio of a pixel density of the first sub-pixels to a pixel density of the second sub-pixels ranges from 1:2 to 1:1.

15. The transparent display panel according to claim 1, wherein
the non-light-transmitting region completely encloses the light-transmitting region.

16. A display device, comprising:
a device body, provided with a component region; and
the transparent display panel according to claim 1 and covering the device body,
wherein the component region is located under the transparent display panel and a photosensitive device configured to emit or collect light through the transparent display panel is arranged in the component region.

* * * * *